US006870866B2

(12) United States Patent
Gao

(10) Patent No.: US 6,870,866 B2
(45) Date of Patent: Mar. 22, 2005

(54) POWERPACK LASER DIODE ASSEMBLIES

(75) Inventor: Wei Gao, Acton, MA (US)

(73) Assignee: Axcel Photonics, Inc., Marlborough, MA (US)

(*) Notice: Subject to any disclaimer, the term of this patent is extended or adjusted under 35 U.S.C. 154(b) by 70 days.

(21) Appl. No.: 09/874,501

(22) Filed: Jun. 5, 2001

(65) Prior Publication Data

US 2002/0181526 A1 Dec. 5, 2002

(51) Int. Cl.[7] .............................. H01S 3/04
(52) U.S. Cl. ........................ 372/34; 372/36
(58) Field of Search .................... 372/34, 36

(56) References Cited

U.S. PATENT DOCUMENTS

| 4,714,953 | A | * | 12/1987 | Buller et al. ............ 257/713 |
| 5,177,500 | A | * | 1/1993 | Ng ....................... 347/245 |
| 5,608,267 | A | * | 3/1997 | Mahulikar et al. ....... 257/796 |
| 6,023,481 | A | * | 2/2000 | Kuribayashi et al. ..... 372/34 |
| 6,072,815 | A | * | 6/2000 | Peterson ................ 372/36 |
| 6,188,130 | B1 | * | 2/2001 | Ramirez et al. ......... 257/706 |
| 6,335,548 | B1 | * | 1/2002 | Roberts et al. ......... 257/98 |
| 6,349,104 | B1 | * | 2/2002 | Kato et al. ............ 372/36 |
| 6,368,890 | B1 | * | 4/2002 | Wickstrom et al. ....... 438/29 |
| 6,576,985 | B2 | * | 6/2003 | Chen et al. ............ 257/676 |

FOREIGN PATENT DOCUMENTS

| EP | 0 961 372 A1 | 12/1999 |
| EP | 1 079 484 A2 | 2/2001 |

OTHER PUBLICATIONS

Lee, et al., "The Effect of Bonding Wires on Longitudinal Temperature Profiles of Laser Diodes", *Journal of Lightwave Technology*, 14(8): 1847–1852 (1996).
Grabherr, et al., "Bottom–Emitting VCSEL's for High–CW Optical Output Power", *IEEE Photonics Technology Letters*, 10(8): 1061–1063 (1998).
Patent Abstracts of Japan, Furukawa Electric Co. Ltd., Abstract of JP 09–138326, 1997.
Patent Abstracts of Japan, NEC Corp., Abstract of JP 02–164089, 1990.
International Search Report for PCT/US01/18686 mailed on Jul. 17, 2003.

* cited by examiner

*Primary Examiner*—Minsun Oh Harvey
*Assistant Examiner*—James Menefee
(74) *Attorney, Agent, or Firm*—Mintz, Levin, Cohn, Ferris, Glovsky & Popeo P.C.

(57) ABSTRACT

In one aspect, the invention provides a laser diode assembly, comprising a carrier, a laser diode, a first bonding member, and a second bonding member. The carrier has a conductive layer formed thereon that is sized for attaching at least two bonding members thereto. The laser diode is operably coupled to the carrier and has first and second conductive pads formed thereon. The first and second conductive pads are each sized for attaching at least one bonding member thereto. The first bonding member couples the first conductive pad to the conductive layer of the carrier, and the second bonding member couples the second conductive pad to the conductive layer of the carrier.

30 Claims, 4 Drawing Sheets

POWERPACK LASER DIODE ASSEMBLIES

FIELD OF THE INVENTION

The invention relates to high power laser diode assemblies and, more particularly, to a laser diode assembles that use bonding wires to help provide thermal dissipation.

BACKGROUND OF THE INVENTION

Semiconductor laser diodes are generally known in the art. Typically, semiconductor laser diodes include parallel facets that are formed when semiconductor laser diodes are formed by cleaving a semiconductor crystal along the crystal's natural cleavage planes. The facets help confine light that is emitted by a p-n junction located within the semiconductor laser diode by reflecting back into the semiconductor body a fraction of the light that otherwise would exit the semiconductor body. This reflection of the emitted light promotes a condition where the reflected light oscillates within the semiconductor body. This p-n junction is formed by p-type and n-type doped layers grown on a substrate. P-type and n-type contacts are formed on the surface of these layers.

Because of their numerous advantages, including low cost, small size, high mechanical stability, potential for substantial output power, and very good efficiency (often near 50% for pulsed junction semiconductor laser diodes), semiconductor laser diodes have the potential to replace large inefficient and expensive laser systems in many industrial, scientific, medical and military applications. Semiconductor laser technology also presents one of the most efficient and adaptable methods of generating coherent laser radiation at different wavelengths. By varying the type of semiconductor alloy from which the semiconductor lasers is made, the semiconductor laser diode can produce radiation at a range of wavelengths.

Semiconductor laser diodes can be used as the optical pumping source for fiber-optic networks and communication systems. For example, wavelength division multiplexing (WDM) fiber optic networks use 980-nm pump lasers to amplify signals transmitted through the fiber optics systems simultaneously at different wavelengths. The increased demands on and popularity of WDM fiber optic networks have increased the demands on pump lasers, and increased output power from 980-nm lasers is crucial for high-speed communications systems.

Semiconductor laser diodes can have thermally related issues that limit their ability to provide increased output power. The thermal issues are related to the large heat dissipation of the laser diode per unit area from the laser diodes, which causes elevated junction temperatures and stresses. The optical output of a laser diode declines as it heats up; thus, increases in junction temperature tend to decrease the efficiency and service life of a laser diode. Junction temperature also affects the emitted wavelength of a laser diode. Maintaining a constant junction temperature is important in maintaining a given output wavelength.

When the laser diode is operated at high output power, the temperature increase at the facet due to nonradiative recombination can be large. If the temperature at the facet exceeds the melting point of the semiconductor material used to form the laser, rapid destruction of the facet occurs, which inhibits proper laser diode operation. The increase of junction temperature near the facet may cause catastrophic optical damage (COD), which is permanent damage to the facet. This destruction of the facet results in failure of the device.

Heat sinks often are used with laser diodes to help with heat dissipation, but heat sinks are limited in the amount of power they can dissipate. In addition, present laser diode designs often do not effectively transmit enough of the heat to the heat sink. Increasing the size of the laser diode itself can increase the surface area through which heat can be dissipated, but this method tends to be limited by the size of the chip.

SUMMARY OF THE INVENTION

In one aspect, embodiments of the invention provide systems, methods, and apparatuses to provide a semiconductor laser diode having thermal performance that may provide advantages over the systems described above. In at least one embodiment, the invention can achieve improved thermal performance over prior art designs. In at least one embodiment, the chip forming the laser diode is bonded on both sides of its top side, using at least one bonding element (such as wire and/or ribbon) on each side of the top side of the laser diode.

In at least one embodiment, the invention provides a laser diode assembly, comprising a carrier, a laser diode, a first bonding member, and a second bonding member. The carrier has a top and bottom, the top having a top conductive layer formed thereon, the top conductive layer sized for attaching at least two bonding members thereto. The laser diode is operably coupled to the carrier and has first and second conductive pads formed thereon, the first and second conductive pads each sized for attaching at least one bonding member thereto. The first bonding member couples the first conductive pad to the conductive layer of the laser diode, and the second bonding member couples the second pad to the conductive layer of the laser diode.

Embodiments of the invention may include the following. The laser diode can further comprise first and second electrodes and at least one of the first and second conductive pads of the laser diode can be operably coupled to one of the first and second electrodes of the laser diode. At least one of the first and second conductive pads can be constructed and arranged to dissipate heat resulting from internal power production of the laser diode. Any one or more of the bonding members can be made from a length of conductive material such as wire, ribbon, braid, filament, fiber and tape. The laser diode assembly also can include one or more additional bonding members coupling at least one of the first and second conductive pads to the conductive layer. The laser diode can include a laser ridge having first and second sides, and the first and second conductive pads may be formed, respectively, near or on top of the first and second sides of the laser ridge. The laser diode assembly also can be coupled, such as by mounting, to a heat sink and then a thermo electric cooling (TEC) device.

Embodiments of this aspect can also include the following. In at least one embodiment, the conductive layer formed on the carrier comprises first and second conductive layer portions, wherein the first conductive pad of the laser diode is coupled to the first conductive layer portion of the carrier using a bonding member, and the second conductive pad of the laser diode is coupled to the second conductive layer portion of the carrier using a bonding member. In at least one embodiment, the first and second conductive pads are formed on the p-contact of the laser diode. In at least one embodiment, the first and second conductive pads are formed on the n-contact of the laser diode. In at least one embodiment, at least one of the first and second conductive pads on the laser diode comprises a contact pad. In at least one embodiment, at least one of the first and second conductive pads on the laser diode comprises a protection pad.

In still another aspect, at least one embodiment of the invention provides a method for making a laser diode assembly. A conductive layer sized for attaching at least two bonding members thereto is formed on a carrier. First and second conductive pads are formed on a laser diode, each pad sized for attaching at least one bonding member thereto. The laser diode is operably coupled to the carrier, and bonding members couple the first conductive pad of the laser diode to the conductive layer of the carrier and the second conductive pad of the laser diode to the conductive layer on the carrier.

At least one embodiment of the method operably couples, such as by mounting, the carrier to a heat sink and then a thermo electric cooling (TEC) device. An embodiment of the method includes forming first and second conductive pads on first and second sides of a laser ridge formed on the laser diode. In an embodiment of the invention, the first and second sides of the laser ridge are opposite sides of the laser ridge In still another aspect, at least one embodiment of the invention provides a laser diode assembly comprising a carrier, laser diode, first bonding member, and second bonding member. The carrier is structured and arranged for mounting a laser diode chip thereto and comprises a first electrode area and a second electrode area. The laser diode has a first side mounted to the second electrode area of the carrier and a second side comprising first and second conductive pads. The first bonding member couples the first conductive pad of the laser diode to the first electrode area of the carrier, and the second bonding member couples the second conductive pad of the laser diode to the first electrode area of the carrier. For example, in at least one embodiment, the first bonding member couples the first conductive pad of the laser diode to a p-type contact area on the carrier, and the second bonding member couples the second conductive pad of the laser diode to another p-type contact area on the carrier.

Embodiments of this aspect include the following. In at least one embodiment, the first and second contact areas on the carrier are coupled, such as by mounting, to an n-type electrode and a p-type electrode, respectively, of the laser diode. In at least one embodiment, the first side of the laser diode is the n-side of the laser diode. In at least one embodiment, the first side of the laser diode is the p-side of the laser diode. In at least one embodiment, at least one of the first and second contact areas on the carrier is a p-type contact area, and this p-type contact area may itself comprise one or more contact areas.

In at least one embodiment, the second conductive pad comprises two or more conductive pads. For example, in an embodiment, the second conductive pad comprises three conductive pads, each of which is coupled, via at least one bonding member, to the a p-type contact area on the carrier. In another example, the second conductive pad comprises two conductive pads and the p-type contact area on the carrier comprises two conductive p-type areas. Each of the two conductive pads comprising the second conductive pad can be coupled, via one or more bonding members, to either or both of the two conductive p-type areas.

In an embodiment of this aspect, the diode further comprises a laser ridge having opposing edges, and the first and second conductive pads are adjacent to opposing edges of the laser ridge, which can, for example, be formed substantially near the second side of the laser diode. In at least one embodiment of this aspect, the second side of the laser diode is the top side of the laser diode, a laser ridge is formed substantially near the top side of the laser diode and has first and second sides, and the first and second conductive pads can be disposed on first and second sides, respectively, of the laser ridge. In one embodiment, the first and second sides are on opposite sides of the laser ridge. As those skilled in the art know, the laser ridge may or may not be visible on the surface of the laser diode. For example, some laser diodes have a burred ridge structure.

In an embodiment of invention, a laser diode assembly is provided comprising a carrier, laser diode, first bonding member, and second bonding member. The carrier is structured and arranged for mounting a laser diode chip thereto and comprises first and second electrode areas and a conductive area. In at least one embodiment, the first electrode area is an n-type contact area, and the second electrode area is a p-type contact area. The laser diode has a first side attached to the second electrode area of the carrier and a second side comprising first and second conductive pads. In at least one embodiment, the laser diode has an n-side coupled to an n-type electrode area on the carrier and a p-side coupled to a p-type electrode area on the carrier. In at least one embodiment, the first bonding member couples the first conductive pad of the p-side of the laser diode to the p-side electrode area on the carrier, and the second bonding member couples the second conductive pad on the p-side of the laser diode to the conductive area of the carrier.

Embodiments of the invention thus may provide systems, methods, and apparatuses for providing a semiconductor laser diode capable of providing high output power. Still more embodiments of the invention may provide systems, methods, and apparatuses for providing a semiconductor laser diode with symmetric current injection and heat distribution.

The foregoing and other objects, aspects, features, and advantages of the invention will become more apparent from the following detailed description of the invention when viewed in conjunction with the accompanying Figures and the claims.

BRIEF DESCRIPTION OF THE FIGURES

An understanding of the principles of the invention may be readily attained by reference to the following specification and the accompanying drawings in which.

The Figures are not necessarily to scale, emphasis instead generally being placed upon illustrating the principles of the invention.

DETAILED DESCRIPTION OF THE PREFERRED EMBODIMENT

Traditionally, laser diode chips, such as 980-nm pump laser diode chips, have asymmetric top (p-contact) contact pads for wire bonding the laser diode chip to the chip carrier, which also can be referred to as the submount or hybrid. In present laser diode chip and assembly designs, wires are bonded to only one side of the top side of the laser diode chip.

Figure 1:
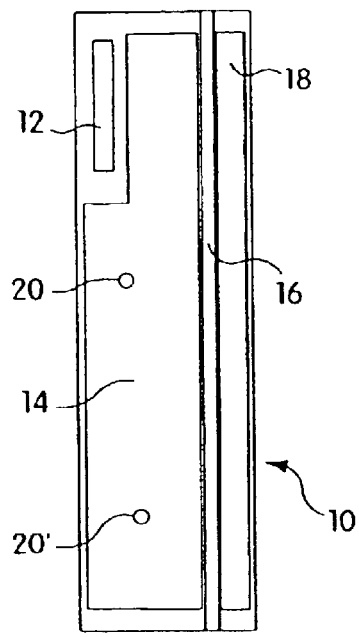
FIG. 1 is a top view of a prior art laser diode chip.

FIG. 1 is an illustration of a prior art laser diode chip 10 where bonds, such as wire bonds, are coupled to only one of its sides. The laser diode chip 10 includes a chip identifier portion 12, a first pad 14 (also referred to as a contact pad/protection pad 14), a laser ridge 16, and a second pad 18 (also referred to as a protection pad 18). The contact/protection pad 14 is an area, such as a metal or metalized area, that provides a contact point for the p-side of the p-n junction of the laser diode 10. The protection pad 18 is a metal or metalized area, and helps to protect the surface of the laser diode chip 10.

The contact/protection pad 14 is of a width (e.g., about 150 micrometers) sufficient to permit bonding wires to be bonded to the contact/protection pad 14, such as at bond locations 20, 20' and to the p-contact area on the chip carrier (see FIG. 2), and is of a thickness sufficient to protect the laser ridge 16 and support wire bonds (e.g., the bonding wires, which can, for example, be about 25 microns in diameter). The protection pad 18 typically is about half the width of the contact pad 14 (e.g., about 75 micrometers). The thickness of the contact/protection pad 14 and the protection pad typically can be from one to ten micrometers thick. In addition, the contact/protection pad 14 and the protection pad 18 are made of a conductive material, such as gold (Au) or gold plated over another material, e.g. Ti and/or Pt, to help to distribute heat generated by the laser diode chip 10.

Figure 2:
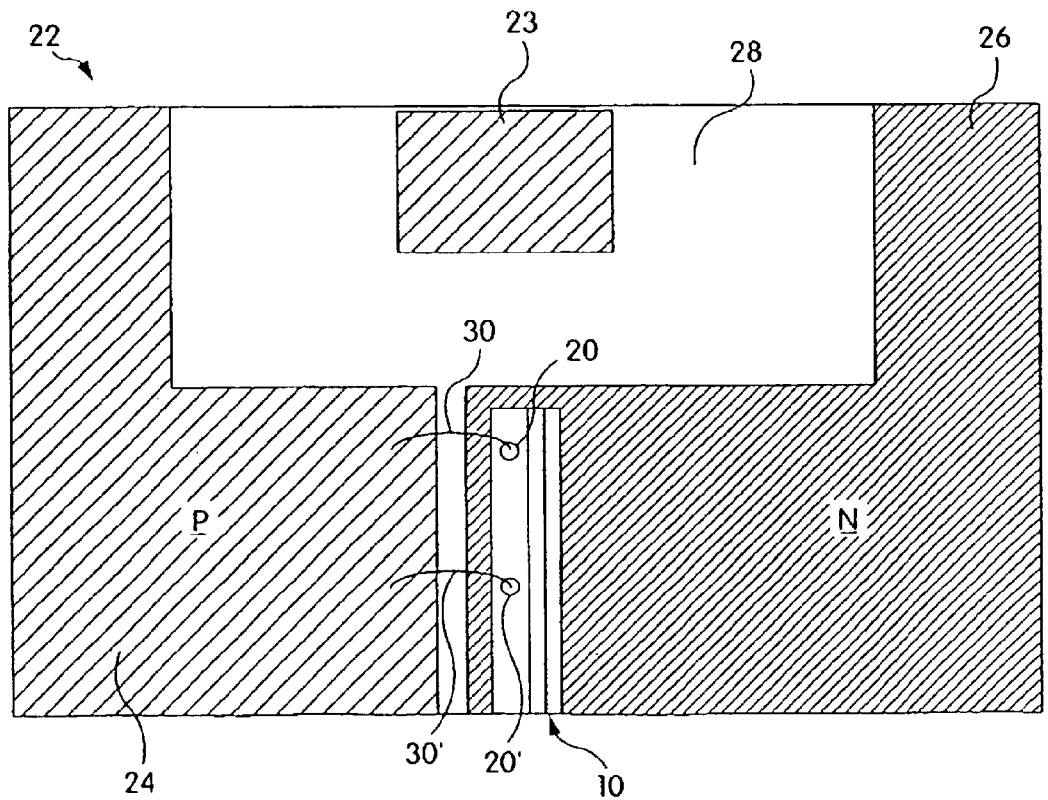
FIG. 2 is a top view of a prior art laser diode assembly.

FIG. 2 is a laser diode assembly 22, showing the laser diode chip 10 of FIG. 1 mounted to a chip carrier 28 which can, for example, be made by metalizing an aluminum nitride substrate in predetermined areas to form p and n regions 24, 20, attaching (e.g. by soldering, welding, conductive adhesives, etc.) the laser diode chip 10 to its respective region (i.e., n region or p region, depending on whether the laser diode is epi up or epi down), and coupling the contact pad 14 of the laser diode chip 10 to the other (n or p region) area of the carrier 28. In some instances, the carrier 28 may be attached (e.g., by soldering, welding, conductive adhesives, etc.) to a heat dissipating device, such as a thermal conductive metal heat sink (which, for example, typically is made from Cu, Ni, etc.; see FIG. 4 for an example of this using the invention), and then to a thermo electric cooling (TEC) device, or even to a stack of TEC cooling devices.

For example, in FIG. 2, the n region 26 of the chip carrier 28 is attached to the n contact at the bottom of the laser diode 10, and the p region 24 of the chip carrier 28 is coupled, via wire bonds 30, 30', to the contact/protection pad 14, which is operably coupled to an appropriate electrode on the laser diode 10. These bonding wires 30, 30' are, for example, made from a conductive material such as gold. The chip carrier 28 is, for example, made from AlN, $Al_2O_3$, BeO, SiC or other suitable materials known to those skilled in the art, such as ceramic material, and also includes an n-type surface contact area 26. The carrier 28 may also include a detector area 23, which is used for mounting a photodiode device (not shown), also known as a back facet detector. As FIG. 2 illustrates, the bonding wires 30, 30' that bond on the p-type metalization contact area of laser diode 10 are coupled on just one side (the contact pad side) of the top side of the laser diode 10.

Figure 3:
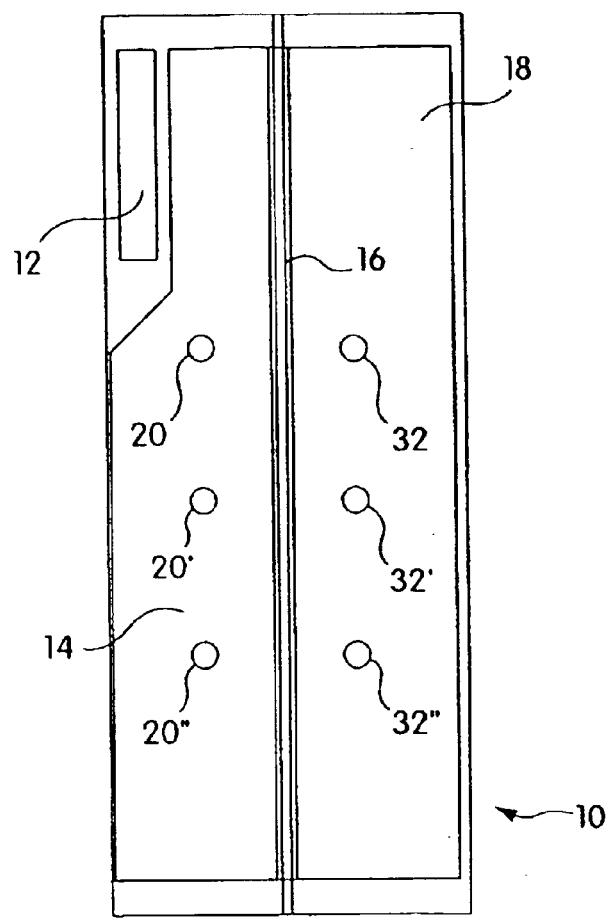
FIG. 3 is a top view of a laser diode chip in accordance with an embodiment of the invention.
Figure 4:
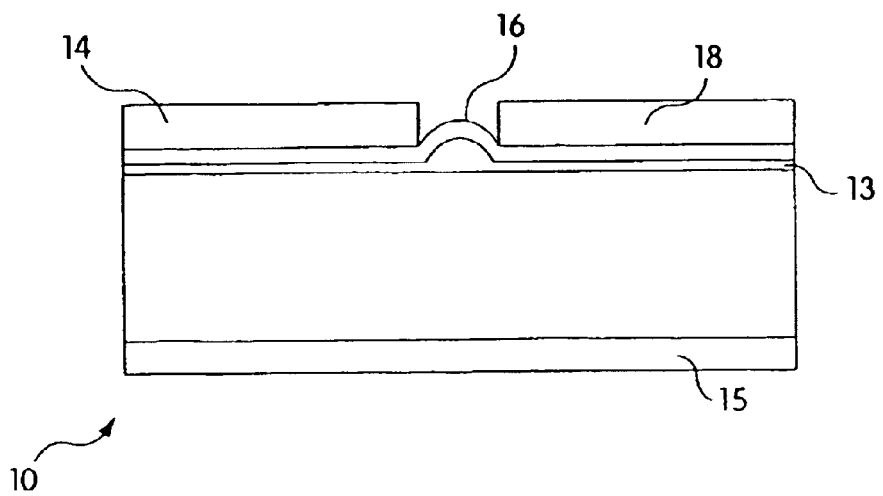
FIG. 4 is a side view, of a laser diode chip in accordance with an embodiment of the invention.

FIGS. 3 and 4 are top and side views, respectively, of a laser diode chip 10 constructed in accordance with at least one embodiment of the invention. Although not illustrated herein, those skilled in the art will recognize that the laser diode chip 10 may be made in a conventional manner, using layers of semiconductor material. In this embodiment of the invention, the width of the protection pad 18 is increased. Thus, with the width of the protection pad 18 increased, the protection pad 18 of FIGS. 3 and 4 is acting as a contact/protection pad (i.e., like the contact/protection pad 14). In at least one embodiment, the width of the protection pad 18 is increased to a sufficient width for attaching bonding members such as wire bonds. In addition, in an embodiment of the invention, the protection pad 18 is constructed and arranged to dissipate heat resulting from internal power dissipation of the laser diode chip 10.

FIG. 4 also illustrates, for purposes of example, the p-metalization 13 and the n-metalization 15 of the laser diode 10, in accordance with at least one embodiment of the invention.

In the example embodiment shown in FIGS. 3 and 4, the width of the protection pad 18 (W1) is approximately the same width (W2) as that of the contact/protection pad 14 (e.g., W1~=W2~=about 150 micrometers wide). The contact/protection pad 14 and the protection pad 18 are of a width sufficient to attach wire bonds thereto (to, for example, locations such as 20, 20', 20'' and 32, 32', 32''). The width of the contact/protection pad 14 and/or that of the protection pad 18 are not limited to a specific size and need not be the same size. For example, either the contact/protection pad 14 or the protection pad 18 can have a width greater than the other, so long as both the contact/protection pad 14 and the protection pad 18 each is sufficiently wide to permit a bonding member, such as a wire bond or ribbon, to be properly attached thereto.

Figure 5:
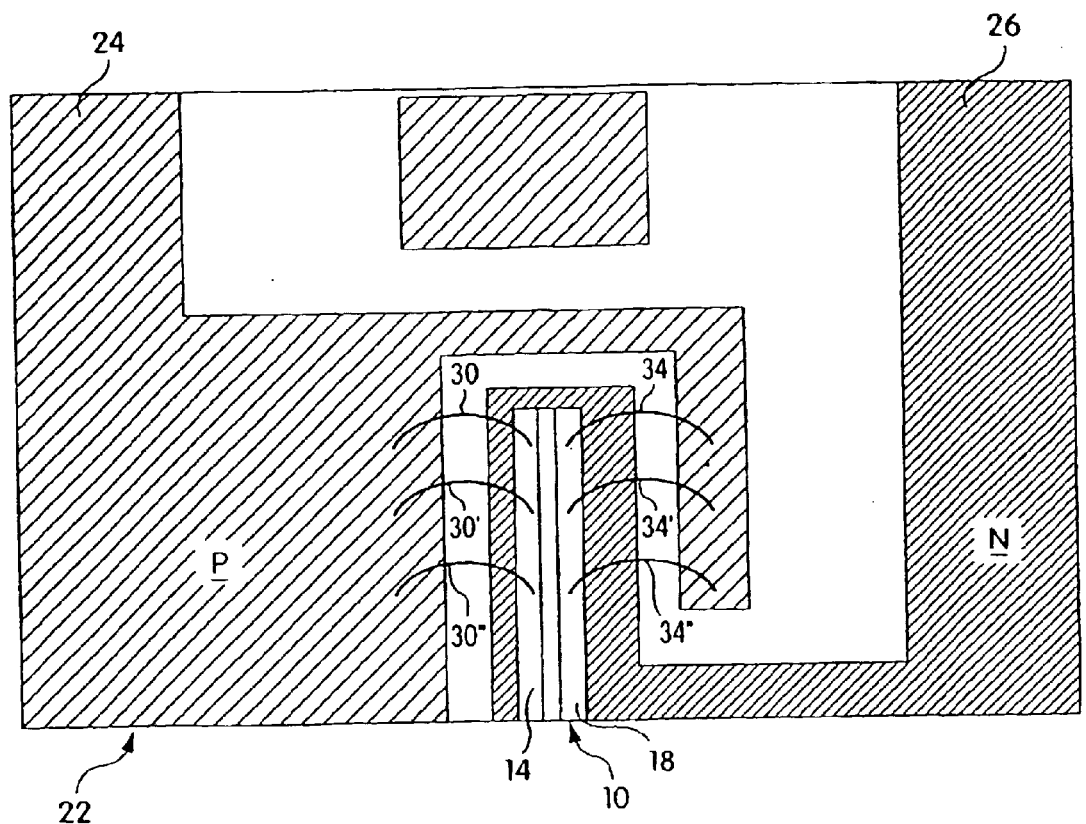
FIG. 5 is a top view of a laser diode assembly in accordance with an embodiment of the invention.

FIG. 5 is a top view of a laser diode assembly 22 constructed in accordance with one embodiment of the invention. In FIG. 5, the laser diode 10 of FIG. 3 has been operably coupled to the p-metalization area 24 of a carrier 28 using both the contact/protection pad 14 and the protection pad 18—i.e., both sides of the p-side of the laser diode 10. The bond wires 30, 30', and 30'' couple the contact/protection pad 14 to the p-metalization area 24 and the bond wires 34, 34', and 34'' couple the protection pad 18, which now acts as a contact/protection pad, to the p-metalization area 24 of carrier 28. The bonding wires 30, 30', 30'', 34, 34', and 34'' are formed from a conducting material such as gold, and have a diameter sized to be able to be bonded to the contact/protection pad 14 and the contact/protection pad 18. For example, in at least one embodiment, the bonding wires have diameters ranging from 2 micrometers to 200 micrometers in diameter (typically, 25 micrometers). The diameter or thickness of the bonding wire also may depend on the amount of current a bonding wire may be expected to carry or the amount of heat to which a bonding wire is subjected (e.g., the amount of heat the bond wire may transfer and/or dissipate).

Although the embodiment of FIG. 5 illustrates that the bonding members 30, 30', 30'', and 34, 34', 34'' are formed from solid wire, other types of conductive materials, such as braid, ribbon, multi-stranded wire, etc., can be used as a bonding member to couple the laser diode 10 to the carrier 28.

Although FIG. 5 illustrates an embodiment where there are three bonding members coupling the each of the contact/protection pad 14 and the protection pad 18 to the carrier 28, the illustrated number of bonding members is not limiting. As few as one member per pad (one for the contact/ protection pad 14 and one for the protection pad 18) are within the spirit and scope of the invention. Another embodiment of the invention uses as many as fifty bonding members on each of the contact/protection pad 14 and the protection pad 18. An unlimited number of bonding members can be used, e.g., depending on the sizes of the laser diode chip 10, the bond members, 30, 34, and/or the carrier 28. In at least one embodiment, the bonding members are not all carriers of electrical signals and at least one bonding member is used solely to dissipate heat.

The top bonding wires (bonding wires, bonding ribbon, etc.) can play either or both of the following two roles for the laser diode 10: (1) electrical connection to the chip carrier 28 and (2) heat sink on top, to remove the heat produced in the junction of the laser diode 10, which heat is dissipated using the contact/protection pad 14 and protection pad 18. For the electrical connection role, providing wire bonds on both sides of the laser diode 10 when there is an electrical connection, as provided in the invention, helps to create symmetric current injection. The invention provides even more advantages when the bonding wires play a heat sink role, especially for a high power laser diode situation.

Using at least one and preferably multiple wire bonds on each side of the laser diode 10 helps to provide multi-path thermal dissipation and helps provide a symmetric heat distribution, resulting in better thermal dissipation for the laser diode 10 and reduction of the thermal lensing effect (thermal lensing is the distortion of an optical path as a result of heat, which can influence the divergence and the mode quality of a beam passing through the laser diode). This also can reduce thermally-induced failures of the laser diode. Better thermal conductivity reduces the heat build up for the laser chips. In addition, using multiple wire bonds, as shown in FIG. 5, helps provide additional connections that may compensate for the failure of any one of the connections.

Figure 6:
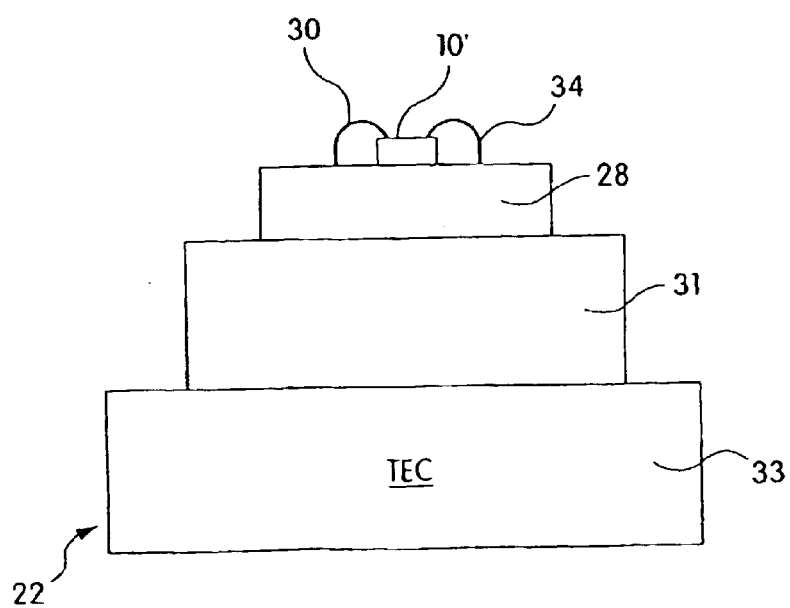
FIG. 6 is a cross-sectional view of the laser diode assembly of FIG. 5.

FIG. 6 is a partial cross-sectional view of a laser diode assembly 22 in accordance with the invention and helps illustrate the operation of an embodiment of the invention. The bonding wires 30 and 34 couple to the p-metalization area 24 (not visible in FIG. 6) of the carrier 28 and to both sides of the laser diode 10. The additional bonding wires 30', 30", 34', and 34" are not visible in this partial cross-sectional view. When the laser diode 10 generates heat to be dissipated, the heat is transferred to the contact/protection pad 14 and protection pad 18 (see FIG. 5), and the bonding wires 30 and 34 help to couple this dissipated heat to the carrier 28. The carrier 28 is constructed to couple this heat through to its bottom surface, where the carrier 28 conducts the heat through a metal plate 31 (e.g., a heat sink), which transmits the heat to a heat pumping device 33, such as a TEC device 33 or stack of TEC devices.

Referring briefly to FIG. 5, in an embodiment of the invention, the p-metalization area 24 of the carrier 28 is shaped such that it "wraps around" the area to which the laser diode 10 is attached, so that the bonding wires 34, 34', and 34" couple to the p-metalization 24 without having to be routed over the contact pad 14. This helps reduce the lengths of the bonding wires 34, 34', and 34" required, and also can help reduce the length of p-metalization area 24 that is needed along the length of the laser diode 10. However, the embodiment of FIG. 5 represents just one of many possible ways that bonding wire can be coupled from the protection pad 18 of the laser diode 10 to the carrier 28. The laser diode 10 and/or the carrier 28 can be constructed and arranged to couple the protection pad 18 to the carrier 28 in many different ways.

For example, in one embodiment (such as the embodiment shown in FIG. 8), the p-metalization area of FIG. 5 may comprise two or more conductive areas 36 that are formed on the carrier 28, and the bonding members on either or both sides of the laser ridge 16 (e.g., any one or more of the bonding members 30, 30', and 30" and/or 34, 34', and 34") may be coupled to either or both of the conductive areas 36. These conductive areas 36 are electrically the same point, but, being separate, they can provide additional dissipation area. In at least one embodiment, any one of the two or more conductive areas 36 can be coupled to a cooling device separate from the cooling device to which any one or more of the other conductive areas are coupled 36. The separate cooling devices, can further increase the thermal performance of the laser diode 10.

Figure 7:
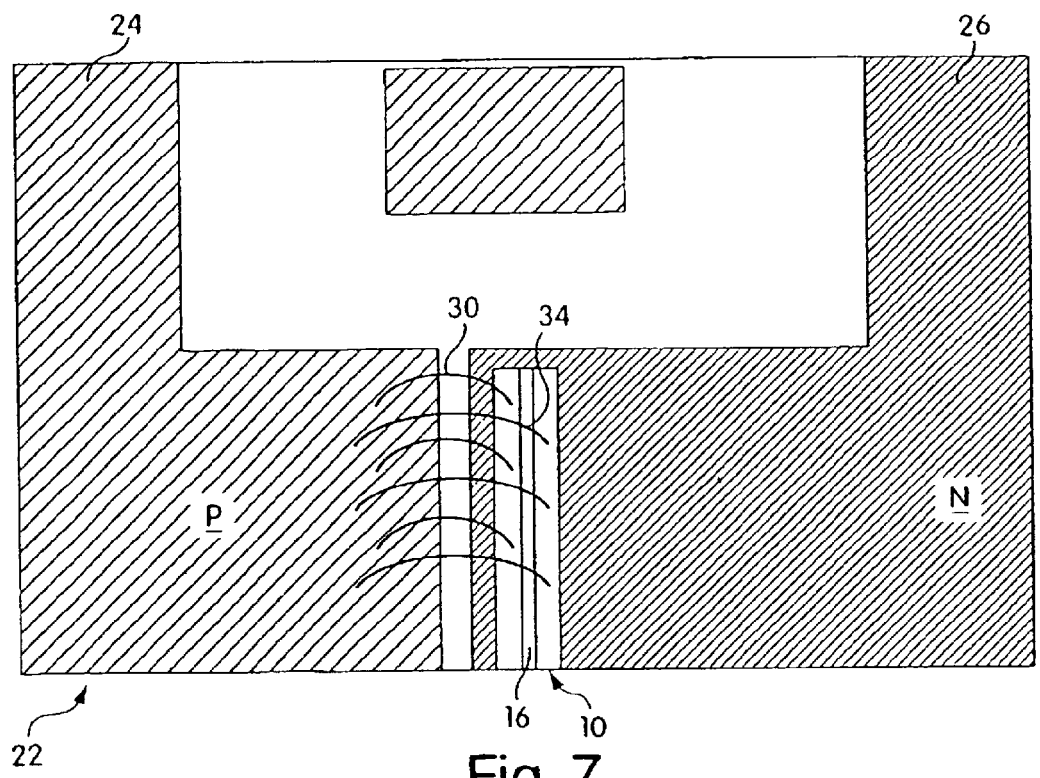
FIG. 7 is a top view of a laser diode assembly in accordance with at least one embodiment of the invention.

For example, FIG. 7 is a top view of a laser diode assembly 22 in accordance with another embodiment of the invention. In FIG. 7, the shape of the p-metalization area 24 is similar to that shown in the laser diode assembly 22 of FIG. 2, and the bonding wires 34, 34', 34" connecting the protection pad 18 to the p-metalization area 24 are routed over the laser ridge 16 and the contact pad 14. Thus, in at least one embodiment of the invention, at least one of the bonding members (e.g., any of the 30 or 34 bonding members) is routed back over the laser ridge 16 towards a conductive area, such as the p-metalization area 24.

Figure 8:
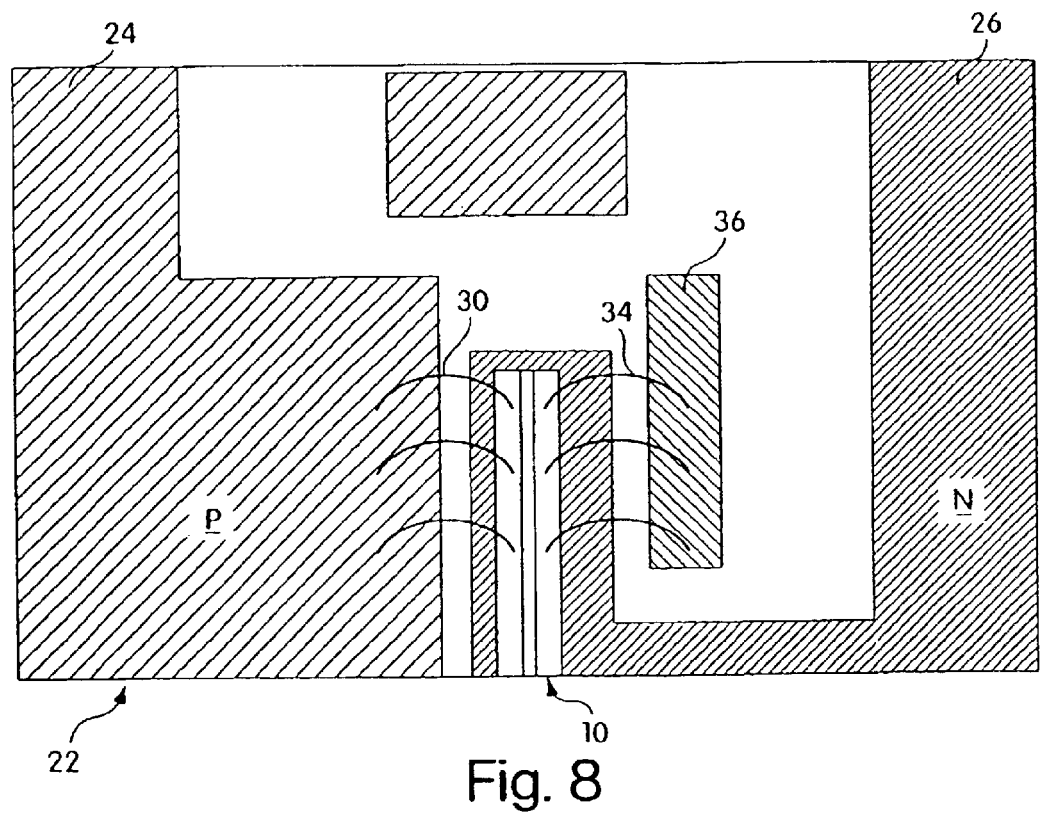
FIG. 8 is a top view of a laser diode assembly in accordance with an embodiment of the invention.

FIG. 8 is another example of a laser diode assembly 22 in accordance with still another embodiment of the invention. In FIG. 8, the carrier 28 is constructed and arranged to include an additional dissipation pad 36, also referred to as a conductive area, to which the bonding wires 34, 34' and 34" coming from the protection pad 18 are coupled. As described above, the additional dissipation pad 36 may be part of the p-metalization area 24. In at least one embodiment, the dissipation pad 36 is not part of the p-metalization area 24, and bonding wires 34, 34' and 34" are used solely for heat dissipation.

Using the laser diode assemblies of the invention may increase the ability of laser diodes to dissipate heat and may greatly increase the reliability of these devices. Although embodiments of the invention were described in reference to laser diode chips operating using 980-mn pump lasers, embodiments of the invention may be applicable to many other different wavelengths and types of laser diode designs, and may be particularly useful for "longer" laser diode chips (e.g., 300 micrometers or greater). Embodiments of the invention may be usable with devices operating using many different wavelengths of light, including UV, visible, and/or infrared. In addition, the invention also is useful for any type of devices requiring a means for heat dissipation (including, but not limited to, laser diodes, semiconductor optical amplifiers, and semiconductor modulators). Embodiments of the invention may also be useful for devices that are constructed using low or poor thermal quality materials.

In addition, although the illustrated embodiments of the invention are shown using laser diodes mounted in an "epi up" (e.g., p-side up) chip mounting scheme, the invention also can be used with an "epi down" (e.g., p-side down) chip mounting scheme (e.g., the bonding wires are on the "n" side of the laser diode chip instead of the "p" side of the chip). Those skilled in the art will recognize that embodiments of the invention are equally applicable to epi down (p-side down) style laser diodes.

In the Figures, in some instances, more than one element may be shown as illustrative of a particular element, and a single element may be shown as illustrative of more than one element. Unless otherwise stated herein, showing more than one of a particular element does not imply that a system implemented in accordance with the invention must comprise more than one of that element, nor does illustrating a single element imply that the invention is limited to embodiments having only a single one of that element. In addition, unless otherwise recited herein, the total number of elements illustrated as representing a particular element is not limiting; those skilled in the art will recognize that the number of a particular system element can be selected to accommodate the particular user needs.

Having thus described at least one illustrative embodiment of the invention, various alterations, modifications and improvements will readily occur to those skilled in the art. Such alterations, modifications and improvements are intended to be within the scope and spirit of the invention, and the foregoing description is by way of example only and is not intended as limiting. Accordingly, the invention is to be defined not only by the preceding illustrative descriptions and drawings but also from the claims.

What is claimed is:

1. A laser diode assembly for high output power applications, comprising:
    a carrier having a top and bottom, the top having a thermally conductive layer formed thereon, the thermally conductive layer sized for attaching at least two bonding members thereto;
    a laser diode having a top and bottom, the bottom of the laser diode being electrically coupled to the carrier, the top of the laser diode having first and second thermally conductive pads formed on opposing sides of the top, the first and second thermally conductive pads each sized for attaching at least one bonding member thereto;
    a first bonding member thermally coupling the first thermally conductive pad to the thermally conductive layer, and
    a second bonding member thermally coupling the second thermally conductive pad to the thermally conductive layer,
    wherein at least one of the first and second bonding members carries an electrical signal.

2. The laser diode assembly of claim 1 wherein the carrier comprises an insulating material.

3. The laser diode assembly of claim 1 wherein the carrier comprises a material selected from the group consisting of Si, diamond, SiC, AlN, and BeO.

4. The laser diode assembly of claim 1 wherein the laser diode further comprises a laser ridge formed therein.

5. The laser diode assembly of claim 4 wherein the laser ridge is formed between at least a portion of the first and second thermally conductive pads.

6. The laser diode assembly of claim 4 wherein at least one of the first and second bonding members thermally couples its respective thermally conductive pad to the conductive layer without passing over the laser ridge.

7. The laser diode assembly of claim 4 wherein the laser ridge is formed substantially near the top side of the laser diode.

8. The laser diode assembly of claim 1, wherein the laser diode further comprises first and second electrodes, and the first and second thermally conductive pads are coupled to one of the first and second electrodes.

9. The laser diode assembly of claim 1, wherein at least one of the first and second thermally conductive pads is constructed and arranged to dissipate heat resulting from internal power production of the laser diode.

10. The laser diode assembly of claim 1, wherein at least one of the first and second bonding members comprises a length of thermally conductive material selected from the group consisting of wire, ribbon, braid, filament, fiber and tape.

11. The laser diode assembly of claim 1, further comprising a third bonding member electrically coupling at least one of the first and second conductive pads to the conductive layer of the carrier.

12. The laser diode assembly of claim 1, wherein the thermally conductive layer of the carrier comprises separate first and second portions, wherein at least one of the first and second bonding members is thermally coupled to the first portion and at least one of the first and second bonding members is thermally coupled to the second portion.

13. The laser diode assembly of claim 12, wherein the first portion is electrically isolated from the second portion.

14. The laser diode assembly of claim 1 wherein the carrier is constructed and arranged to transfer heat from thermally conductive layer to the bottom of the carrier.

15. The laser diode assembly of claim 14 further comprising a heat sink operably coupled to the bottom of the carrier.

16. The laser diode assembly of 15 further comprising a thermo electric cooling (TEC) device operably coupled to the heat sink.

17. The laser diode assembly of claim 1, wherein the laser diode further comprises an n-side and a p-side, and at least one of the first and second conductive pads is disposed substantially on the p-side of the laser diode.

18. The laser diode assembly of claim 1, wherein the laser diode further comprises an n-side and a p-side, and at least one of the first and second conductive pads is disposed substantially on the n-side of the laser diode.

19. The laser diode assembly of claim 1, wherein at least one of the first and second bonding members comprises a set of at least two bonding members.

20. The laser diode assembly of claim 19 wherein the number of first bonding members is equivalent to the number of second bonding members.

21. The laser diode assembly of claim 19, wherein the number of first bonding members is not equivalent to the number of second bonding members.

22. The laser diode assembly of claim 1 wherein the laser diode is a 980-nm pump laser diode.

23. The laser diode assembly of claim 1, wherein the laser diode is part of a semiconductor optical amplifier.

24. The laser diode assembly of claim 1, wherein the laser diode is part of a semiconductor modulator.

25. The laser diode assembly of claim 1 wherein the laser diode operates over at least a portion of the ultraviolet to far infrared wavelength range.

26. The laser diode assembly of claim 1 wherein the carrier is structured and arranged for mounting a laser diode thereto.

27. A laser diode assembly, comprising:
    a carrier structured and arranged for mounting a laser diode chip thereto, the carrier comprising a first electrode area, a second electrode area, and a thermally conductive area;
    a laser diode having a first side attached to the second electrode area of the carrier and having a second side comprising first and second thermally conductive pads;
    a first bonding member coupling the first thermally conductive pad of the laser diode to the first electrode area of the carrier; and
    a second bonding member coupling the second thermally conductive pad of the laser diode to the thermally conductive area of the carrier.

28. A laser diode assembly, comprising:

a carrier having a thermally conductive layer formed thereon;

a laser diode electrically coupled to the carrier; and a means for transferring heat generated at the diode to the thermally conductive layer on the carrier, the means for transferring heat being thermally coupled to the carrier from the laser diodes, wherein the means for transferring heat comprises first and second thermally conductive pads disposed on a side of the laser diode and first and second bonding members coupling the first and second thermally conductive pads of the laser diode to the conductive layer on the carrier.

29. The laser diode assembly of claim 28, wherein the carrier is constructed and arranged to convey heat transferred to the thermally conductive layer to a means for cooling.

30. The laser diode assembly of claim 28, wherein the laser diode further comprises a laser ridge formed between the first and second thermally conductive pads.

* * * * *